United States Patent
Jang et al.

(10) Patent No.: US 8,723,158 B2
(45) Date of Patent: May 13, 2014

(54) LIGHT EMITTING DIODE, LIGHT EMITTING DEVICE PACKAGE INCLUDING THE SAME AND LIGHTING SYSTEM

(75) Inventors: Jung Hun Jang, Seoul (KR); Jeong Sik Lee, Seoul (KR); Jeong Soon Yim, Seoul (KR); Byeoung Jo Kim, Seoul (KR); Seung Keun Nam, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 19 days.

(21) Appl. No.: 13/368,133

(22) Filed: Feb. 7, 2012

(65) Prior Publication Data
US 2012/0138893 A1 Jun. 7, 2012

(30) Foreign Application Priority Data
Jun. 9, 2011 (KR) .................. 10-2011-0055646

(51) Int. Cl.
*H01L 29/06* (2006.01)
(52) U.S. Cl.
USPC ................................. 257/13; 438/13

(58) Field of Classification Search
USPC ................................. 257/13; 438/20
See application file for complete search history.

(56) References Cited

U.S. PATENT DOCUMENTS

2007/0096077 A1* 5/2007 Sanga et al. ............... 257/13

* cited by examiner

*Primary Examiner* — Jami M Valentine
(74) *Attorney, Agent, or Firm* — Birch, Stewart, Kolasch & Birch, LLP

(57) ABSTRACT

A light emitting device includes a light emitting structure including a first conductive type semiconductor layer, an active layer and a second conductive type semiconductor layer; a multi-contact layer disposed on at least a predetermined region of the second conductive type semiconductor layer, the multi-contact layer including at least one pair-structure configured of a first layer including InGaN having a dopant doped thereon and a second layer including GaN having a different dopant doped thereon; and a first electrode and a second electrode to provide currents to the first conductive type semiconductor layer and the second conductive type semiconductor layer, respectively.

20 Claims, 14 Drawing Sheets

LIGHT EMITTING DIODE, LIGHT EMITTING DEVICE PACKAGE INCLUDING THE SAME AND LIGHTING SYSTEM

CROSS-REFERENCE TO RELATED APPLICATION

This application claims priority under 35 U.S.C. §119 from Korean Application No. 10-2011-0055646 filed on Jun. 9, 2011, the subject matter of which is hereby incorporated in its entirety by reference as if fully set forth herein.

TECHNICAL FIELD

Embodiments may relate to a light emitting diode, a light emitting device package including the same and a lighting system.

BACKGROUND

Due to development of thin film growth techniques and device materials, light emitting devices such as light emitting diodes and laser diodes using III-V or II-VI compound semiconductor materials may realize red, green, blue and various color light and ultraviolet light and may realize white light having high efficiency through fluorescent materials or color mixing. Compared with a conventional light source such as a fluorescent lamp and an incandescent lamp, such the light emitting device has several advantages of low power consumption, semipermanent usage, fast response speed, safety and environment-friendliness.

As a result, those light emitting devices have been increasingly applied not only to display devices but also to transmission modules of light communication means, light emitting diode backlights substituting for cold cathode fluorescent lamps composing backlights of liquid crystal displays (LCD), white light emitting diode lighting apparatus substituting for fluorescent lamps or incandescent lamps, head lights of vehicles and street lights.

SUMMARY

Accordingly, the embodiments may provide a light emitting device, a light emitting device package including the same and a lighting system.

In one embodiment, a light emitting device includes a light emitting structure comprising a first conductive type semiconductor layer, an active layer and a second conductive type semiconductor layer; a multi-contact layer disposed on at least predetermined region of the second conductive type semiconductor layer, the multi-contact layer including at least one pair-structure configured of a first layer including InGaN having a dopant doped thereon and a second layer including GaN having a different dopant doped thereon; and a first electrode and a second electrode to provide currents to the first conductive type semiconductor layer and the second conductive semiconductor layer, respectively.

In another embodiment, a light emitting device includes a light emitting structure including a first conductive type semiconductor layer, an active layer and a second conductive type semiconductor layer; a multi-contact layer disposed on at least predetermined region of the second conductive type semiconductor layer, the multi-contact layer including at least one pair-structure configured of a first nitride semiconductor layer having a dopant doped thereon and a second nitride semiconductor layer having a dopant doped thereon; and a first electrode and a second electrode to provide currents to the first conductive type semiconductor layer and the second conductive semiconductor layer, respectively.

In an embodiment, a light emitting device package includes a package body; a first lead frame and a second lead frame disposed on the package body; a light emitting device disposed on the package body, with being electrically connected with the first lead frame and the second lead frame, the light emitting device a light emitting structure including a first conductive type semiconductor layer, an active layer and a second conductive type semiconductor layer; a multi-contact layer disposed on at least predetermined region of the second conductive type semiconductor layer, the multi-contact layer including at least one pair-structure configured of a first layer including InGaN having a dopant doped thereon and a second layer comprising GaN having a different dopant doped thereon.

According to the embodiments, reliability of the light emitting device may be enhanced.

In a further embodiment, a lighting system includes a light source comprising a plurality of light emitting device packages disposed on a substrate, to emit light; a housing having the light source therein; a radiation part to radiate the heat of the light source; and a holder to couple the light source and the radiation part to the housing.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
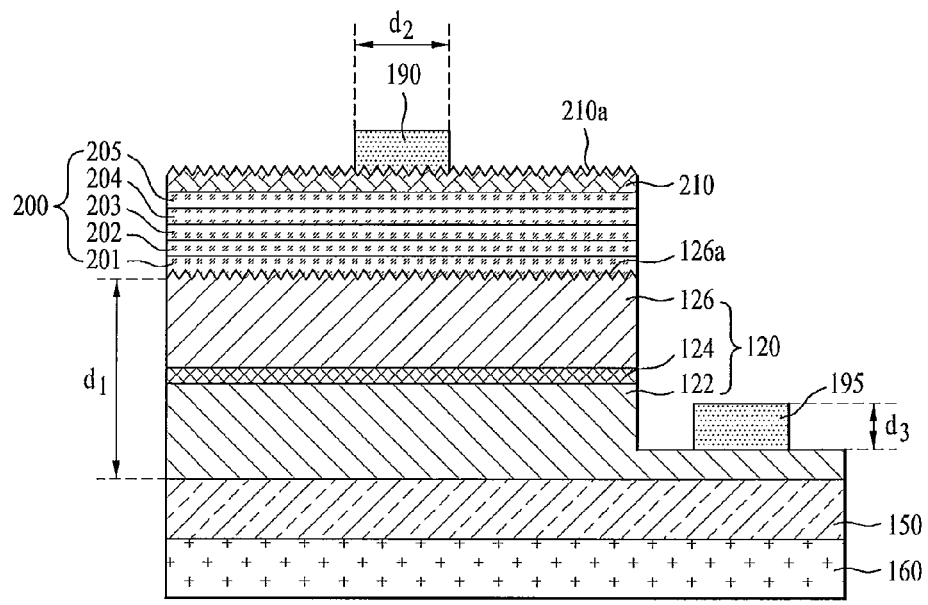
FIG. 1 is a sectional view illustrating a light emitting device according to an embodiment.

Hereinafter, embodiments will be described with reference to the annexed drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

The thickness or size of each layer shown in the drawings may be exaggerated, omitted or schematically illustrated. The size of each element illustrated in the drawings may not reflect the substantial size fully.

FIG. 1 is a sectional view illustrating a light emitting device according to an embodiment.

In these embodiments or other embodiments, the light emitting device may be semiconductor light emitting device, for example, light emitting diode.

In reference to FIG. 1, the light emitting device according to this embodiment may include a buffer layer 150 formed on a substrate 160, a light emitting structure 120 having a first conductive type semiconductor layer 122 formed on the buffer layer 150, an active layer 124 and a second conductive type semiconductor layer 126, a multi-contact layer 200 formed on the second conductive type semiconductor layer, a transparent electrode layer 210 formed on the multi-contact layer 200, a second electrode 190 formed on the transparent electrode layer 210, and a first electrode 195 formed on the first conductive type semiconductor layer 122.

The buffer layer 150 may be employed to reduce lattice mismatch of the materials between the light emitting structure 120 and the substrate 110 and to reduce a difference of thermal expansion coefficients there between. The transparent electrode layer 210 may be employed to enhance electric properties between the second conductive type semiconductor layer 126 and the second electrode 190. It is not necessary to form the buffer layer 150 and the transparent electrode layer 210.

The first conductive type semiconductor layer 122 and the active layer 124, the second conductive type semiconductor layer 126 and the multi-contact layer 200 and the first electrode 195 and the second electrode 190 may be stacked with the same directivity.

In addition, the first conductive type semiconductor layer 122, the active layer 124 and the second conductive type semiconductor layer 126 may be disposed adjacent to each other, with the same directivity, and they may have the different thicknesses, respectively.

The thickness (d1) of the light emitting structure 120 may be approximately 8.5~9.0 um.

The substrate 160 may be formed of a conductive substrate or an insulative substrate. For example, the substrate 160 may use at least one of sapphire ($Al_2O_3$), SiC, Si, GaAs, GaN, ZnO, Si, GaP, InP or $Ga_2O_3$.

Although not shown in the drawings, the substrate 160 may include a light extraction structure such as an unevenness structure formed on a surface thereof adjacent to the light emitting structure 120. In other words, according to this embodiment, a periodic or non-periodic patterned substrate 160 such as a patterned sapphire substrate (PSS) or a lateral epitaxy on patterned substrate (LEPS) may be used, and the embodiment is not limited thereto.

The buffer layer 150 may be formed of III-V compound semiconductor materials, for example, at least one of GaN, InN, AlN, InGaN, AlGaN, InAlGaN or AlInN. An undoped semiconductor layer (not shown) may be formed on the buffer layer and this embodiment is not limited thereto.

The first conductive type semiconductor layer 122 may be formed of a semiconductor compound material, for example, III-V or II-VI compound semiconductor materials and first conductive type dopant may be doped thereon. If the first conductive type semiconductor layer 122 is a n-semiconductor layer, the first conductive type dopant may include Si, Ge, Sn, Se or Te as the n-semiconductor and the embodiment is not limited thereto. If the first conductive type semiconductor layer 122 is a p-semiconductor layer, the first conductive type dopant may include Mg, Zn, Ca, Sr or Ba as the p-dopant.

The active layer 124 may be a layer configured to emit a light having a predetermined energy determined by an unique energy band of a material forming an active layer (luminous layer), after a carrier injected via the first conductive type semiconductor layer 122 meets a carrier injected via the second conductive type semiconductor layer 126.

The second conductive type semiconductor layer 126 may be formed of semiconductor compound, for example, a III-V compound semiconductor having a second conductive type dopant doped thereon. The second conductive type semiconductor layer 126 may include a semiconductor material having a following empirical formula: $In_xAl_yGa_{1-x-y}N$ ($0 \le x \le 1$, $1 \le y \le 1$, $0 \le x+y \le 1$), for example. If the second conductive type semiconductor layer 126 is a p-semiconductor layer, the second conductive type dopant may include Mg, Zn, Ca, Sr or Ba as p-dopant. If the second conductive type semiconductor layer 142 is an n-semiconductor layer, the second conductive type semiconductor layer may include Si, Ge, Sn, Se or Te as the n-dopant.

The multi-contact layer 200 may be partially or entirely formed on the second conductive type semiconductor layer 126.

According to this embodiment, an unevenness structure 126a may be formed on the second conductive type semiconductor layer 126 and the multi-contact layer 200 may be on the unevenness structure after that. At this time, the unevenness structure may be formed based on PEC method or it may be formed after etching a mask.

The multi-contact layer 200 may be formed between the second conductive type semiconductor layer 126 and the transparent electrode layer 210, to reduce operation voltages of the light emitting device.

A top surface of the transparent electrode layer 210 may have an unevenness structure 210a. The light generated from the active layer may be scattered-reflected in the unevenness structure 210a, not full-reflected, only to enhance light extraction efficiency of the light emitting device.

The multi-contact layer 200 may include multi-layers. Compared with a single-contact layer, the multilayered-contact layer 200 may reduce the operation voltages of the light emitting device stably.

For example, the multi-contact layer 200 may include a pair structure configured of a first layer formed of InGaN having a dopant doped thereon and a second layer formed of GaN having a dopant or a different dopant doped thereon. The number of the pair structures may be one or more.

According to an embodiment, the dopant may be a first conductive type dopant such as Si, Ge, Sn, Se or Te.

According to another embodiment, the dopant may be a second conductive type semiconductor layer such as Mg, Zn, Ca, Sr or Ba.

At this time, a doping level for each of the first layer formed of InGaN having the dopant doped thereon and the second layer formed of GaN having the dopant doped thereon may be $10^{18} \sim 10^{19}/cm^2$.

Also, a concentration level of $In$ included in the first layer formed of InGaN having the dopant doped thereon may be set in a range of 2~8%.

The thickness of the multi-contact layer 200 may be set in a range of 5~40 Å. The thickness of the first layer formed of the InGaN having the dopant doped thereon or the second layer formed of GaN having the dopant doped thereon may be 1.25~4 Å.

Here, if the thickness of each layer is thinner than 1.25 Å, reproducibility may be degraded and if the thickness is too thick, especially, the GaN layer is thicker, $V_f$ might be larger.

For example, the multi-contact layer 200 may include a first layer 201 formed of InGaN having Si doped thereon, a second layer 202 formed of GaN having Si doped thereon, a third layer 203 formed of InGan having Si doped thereon, a fourth layer 204 formed of GaN having Si doped thereon, and a fifth layer 205 formed of InGaN having Si doped thereon.

Two to five or more layers having the InGaN/GaN structure mentioned above may be provided in the multi-contact layer 200. If the number of the layers is too large, $V_f$ might be large or light absorption might occur.

The transparent electrode layer 210 may be formed on the second conductive type semiconductor layer 126 to enable the second conductive type semiconductor layer 126 to electrically contact with the second electrode 190. At this time, the transparent electrode layer 210 may be formed of indium tin oxide (ITO), for example. More specifically, the transparent electrode layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh or Pd.

The thickness of the transparent electrode layer 210 may be approximately 60~170 nm.

The second electrode 190 may be formed on the transparent electrode layer 210. For example, the second electrode 190 may be formed of a selected material from molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy of those metals. The second electrode 190 may be partially provided on the second conductive type semiconductor layer 126 and it may be formed by using a mask.

The first electrode 195 may be formed on an exposed region of the first conductive type semiconductor layer 122 that is exposed after mesa-etching a predetermined region of the multilayered-contact layer 200, the second conductive type semiconductor layer 126, the active layer 124 and the first conductive type semiconductor layer 122. The first electrode 195 may be formed of the same material of the second electrode 190 mentioned above.

The thickness of the multi-contact layer 200, the second conductive type semiconductor layer 126, the active layer 124 and the first conductive type semiconductor layer 122, eliminated by mesa etching, may be approximately 800 nm. The thickness may have a tolerance of ±10% according to the design.

Each of the first and second electrodes 195 and 190 may have the width (d2) of approximately 50~150 um.

In addition, each of the first and second electrodes 195 and 190 may have the thickness (d3) of approximately 1000~1500 nm.

As a result, the light emitting device according to this embodiment may include the multi-contact layer formed on the light emitting structure and the operation voltages of the light emitting device may be reduced, only to enhance the performance of the light emitting device.

The light emitting device according to the embodiment may be fabricated to have an overall height of approximately 100~200 um or 100~300 um and the overall height may be differentiated according to the thickness of the multi-contact layer 200 located on the second conductive type semiconductor layer 126. The detailed description of each element will be made in reference to FIGS. 2a to 2e.

FIGS. 2a to 2e are diagrams illustrating a method according to an embodiment for fabricating the light emitting device.

First of all, a substrate 160 may be prepared. The substrate 160 may be a conductive substrate or an insulative substrate. For example, it may include at least one of sapphire ($Al_2O_3$), SiC, Si, GaAs, GaN, ZnO, Si, GaP, InP, Ge or $Ga_2O_3$.

According to the embodiment, the substrate 160 may include the unevenness structure formed on a surface thereof. In other words, according to this embodiment, a periodic or non-periodic patterned substrate 160 such as a patterned sapphire substrate (PSS) or a lateral epitaxy on patterned substrate (LEPS) may be used, and the embodiment is not limited thereto. Wet-cleaning may be performed to the substrate 160 and impurity may be eliminated from the surface of the substrate 160.

Hence, on the substrate 160 may be formed the light emitting structure 120 including the first conductive type semiconductor layer 122, the active layer 124 and the second conductive type semiconductor layer 126.

At this time, the buffer layer 150 may grow between the light emitting structure 120 and the substrate 160, to reduce lattice mismatch of materials and a difference of coefficients of thermal expansion. The buffer layer 150 may be formed of III-V compound semiconductor materials, for example, at least one of GaN, InN, AlN, InGaN, AlGaN, InAlGaN or AlInN. An undoped semiconductor layer may be formed on the buffer layer 150 and the present embodiment is not limited thereto.

Also, the light emitting structure 120 may be formed based on metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE).

The first conductive type semiconductor layer 122 may be realized by III-V compound semiconductor materials having a first conductive type dopant doped thereon. In case the first conductive type semiconductor layer 122 is an n-semiconductor layer, the first conductive type dopant may include Si, Ge, Sn or Te as n-dopant and the embodiment is not limited thereto.

The first conductive type semiconductor layer 122 may include a semiconductor material having a following empirical formula: $Al_xIn_yGa_{(1-x-y)}N$ ($0 \leq x \leq 1$, $0 \leq y \leq 1$, $0 \leq x+y \leq 1$). For example, the first conductive type semiconductor 122 may be formed of one or more of GaN, InN, AlN, InGaN, AlGaN, InAlGaN, AlInN, AlGaAs, InGaAs, AlInGaAs, GaP, AlGaP, InGaP, AlInGaP or InP.

The first conductive type semiconductor layer 122 may be formed by injecting into a chamber silane gas ($SiH_4$) including n-impurity such as TMGa, $NH_3$, $N_2$ or Si.

The active layer 124 may be a layer configured to emit a light having a predetermined energy determined by a unique energy band of a material forming an active layer (luminous layer), after a carrier injected via the first conductive type semiconductor layer 122 meets a carrier injected via the second conductive type semiconductor layer 126.

The active layer 124 may be formed in at least one of Single Quantum Well structure, Multi Quantum Well (MQW) structure, Quantum-Wire structure and Quantum Dot structure. For example, trimethyl gallium gas (TMGa), ammonia gas ($NH_3$), nitrogen gas ($N_2$) and trimethyl indium gas (TMIn)

are injected to form the active layer 124 in MQW structure, and the embodiment is not limited thereto.

The active layer 124 may have a structure having a well layer and a barrier layer that are layered alternatively at least one time. The well layer/barrier layer structure of the active layer 130 may be formed of a pair of or more pairs of InGaN/GaN, InGaN/InGaN, GaN/AlGaN, InAlGaN/GaN, GaAs(InGaAs)/AlGaAs, GaP(InGaP)/AlGaP and the embodiment is not limited thereto. The well layer may be formed of a material with a predetermined band gap that is smaller than a band gap of the barrier layer.

A conductive type clad layer (not shown) may be formed on and/or under the active layer 124. The conductive type clad layer may be formed of AlGaN-based material and it may have a wider band gap than the band gap of the active layer 124. For example, the conductive type clad layer may include GaN, AlGaN and InAlGaN or it may have a micro-lattice structure. Also, an n-dopant or a p-dopant may be doped on the conductive type clad layer.

The second conductive type semiconductor layer 126 may include a III-V compound semiconductor material having a second conductive type dopant doped thereon. For example, the second conductive type semiconductor layer 126 may include a semiconductor material having a following empirical formula: $In_xAl_yGa_{1-x-y}N$ ($0 \leq x \leq 1$, $0 \leq y \leq 1$, $0 \leq x+y \leq 1$). If the second conductive type semiconductor layer 126 is a p-semiconductor layer, the second conductive type dopant may include Mg, Zn, Ca, Sr or Ba as the p-dopant. If the second conductive type semiconductor layer 126 is an n-semiconductor layer, the second conductive type dopant may include Si, Ge, Sn, Se or T and the embodiment is not limited thereto.

The second conductive type semiconductor 126 may be formed as a p-GaN layer by injecting bisethylcyclopentadienyl magnesium ($EtCp_2Mg$){$Mg(C_2H_5C_5H_4)_2$) having p-dopant such as magnesium (Mg), trimethyl gallium gas (TMGa), ammonia gas ($NH_3$) and nitrogen gas ($N_2$) into a chamber, and the embodiment is not limited thereto.

In this embodiment, the first conductive type semiconductor layer 122 may be a p-semiconductor layer and the second conductive type semiconductor layer 126 may be an n-semiconductor layer. On the second conductive type semiconductor layer 126 may be formed a semiconductor layer having an opposite polarity to a polarity of the second conductive type, for example, an n-semiconductor layer (not shown) if the second conductive type semiconductor layer is a p-semiconductor layer. Because of that, the light emitting structure 120 may be realized in one of n-p, n-p-n and p-n-p junction structures.

The unevenness structure 126 may be formed on the second conductive type semiconductor layer 126. The unevenness structure 126a may be formed based on PEC method or it may be formed after etching a mask.

Figure 2A:
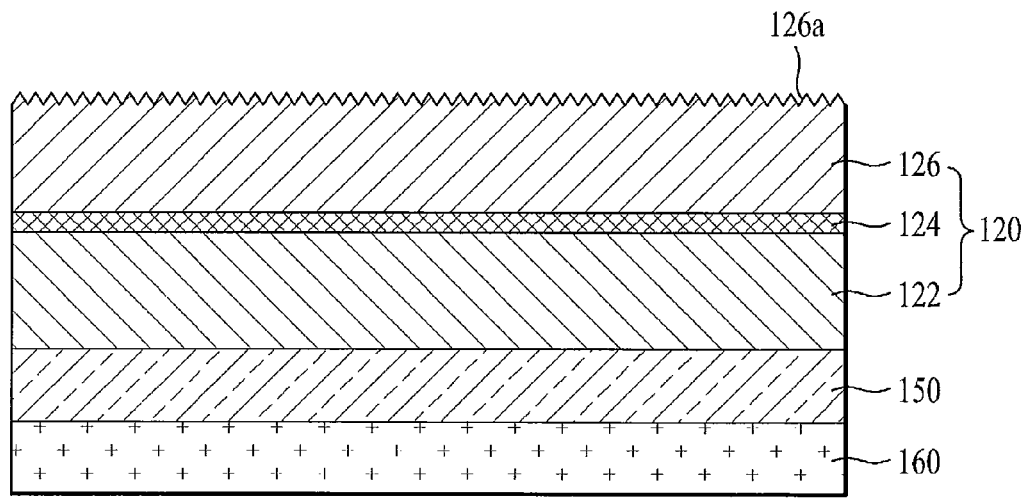
FIGS. 2a and 2e are diagrams illustrating a method for fabricating the light emitting device according to the embodiment.
Figure 2B:
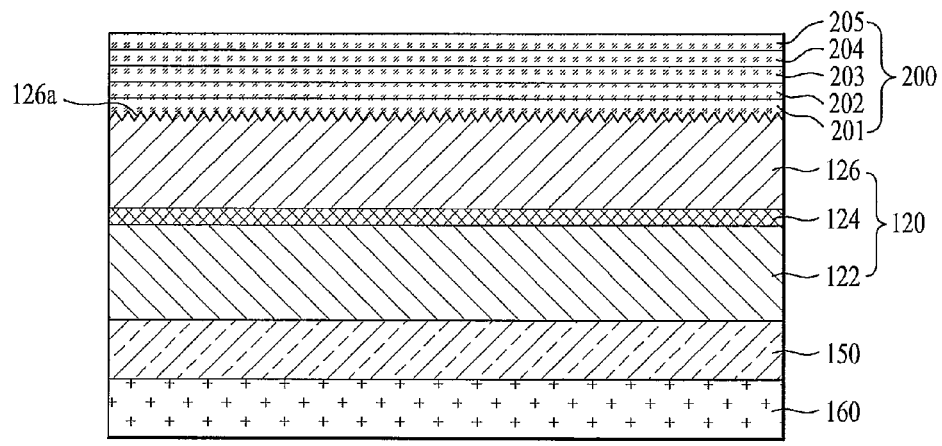

In reference to FIG. 2b, the multi-contact layer 200 may be partially or entirely formed on the light emitting structure 120.

The multi-contact layer 200 may be formed between the second conductive type semiconductor layer 126 and the transparent electrode layer 210, to reduce operation voltages of the light emitting device.

At this time, the multi-contact layer 200 may include InGaN having a dopant doped thereon or GaN having a dopant doped thereon.

The multi-contact layer 200 according to the embodiment may include overlapped multi-layers. Compared with a single-contact layer, the multilayered-contact layer 200 may reduce the operation voltages of the light emitting device stably.

According to an embodiment, the dopant may be a first conductive type dopant such as Si, Ge, Sn, Se or Te.

According to another embodiment, the dopant may be a second conductive type semiconductor layer such as Mg, Zn, Ca, Sr or Ba.

For example, the multi-contact layer 200 may include a pair structure configured of a first layer formed of InGaN having Si doped thereon and a second layer formed of GaN having Si doped thereon. The number of the pair structures may be one or more.

At this time, a doping level for each of the first layer formed of InGaN having the dopant doped thereon and the second layer formed of GaN having the dopant doped thereon may be $10^{18}$~$10^{19}$/cm$^2$. If the doping level is too high, roughness generated on the surface of the light emitting device may be increased. Also, a concentration level of In included in the first layer formed of InGaN having the dopant doped thereon may be set in a range of 2~8%. To reduce $V_f$, a high concentration level of the In may be better but the absorption of the light generated from the active layer will be increased only to degrade luminosity. At this time, the thickness of the multi-contact layer 200 may be set in a range of 5~40 Å. For example, the thickness of the first layer formed of the InGaN having the dopant doped thereon or the second layer formed of GaN having the dopant doped thereon may be 1.25~4.0 Å.

For example, the multi-contact layer 200 may include a first layer 201 formed of InGaN having Si doped thereon, a second layer 202 formed of GaN having Si doped thereon, a third layer 203 formed of InGan having Si doped thereon, a fourth layer 204 formed of GaN having Si doped thereon, and a fifth layer 205 formed of InGaN having Si doped thereon.

Figure 2C:
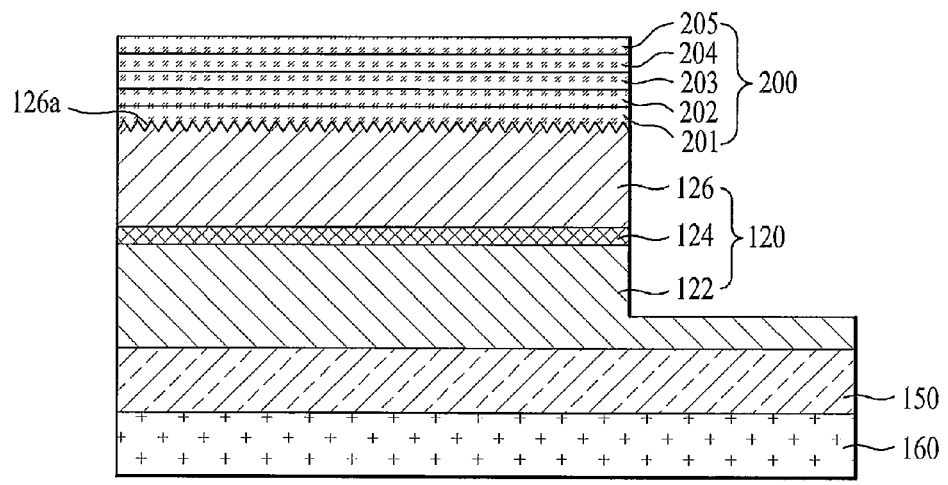

In reference to FIG. 2c, mesa-etching may be performed from the multi-contact layer 200 to a predetermined region of the first conductive type semiconductor layer 122, according to reactive ion etching (RIE).

For example, when the insulative substrate such as a sapphire substrate is used, an electrode may not be formed on a back side of the substrate. Since the mesa-etching is performed from the second conductive type semiconductor layer 126 to the predetermined region of the first conductive semiconductor layer 122, the space in which the electrode can be formed may be secured.

According to the embodiment, the unevenness structure 126a may be formed on the second conductive type semiconductor layer 126 and the multi-contact layer 200 may be formed on the unevenness structure after that. At this time, the unevenness structure may be formed by PEC method or etching a mask.

In the PEC method, the etching velocity may be adjusted by the amount of etching liquid, for example, KOH and GaN crystallizability and the shape of the nano-sized unevenness may be adjusted accordingly. The unevenness structure may be formed periodically or non-periodically.

Figure 2D:
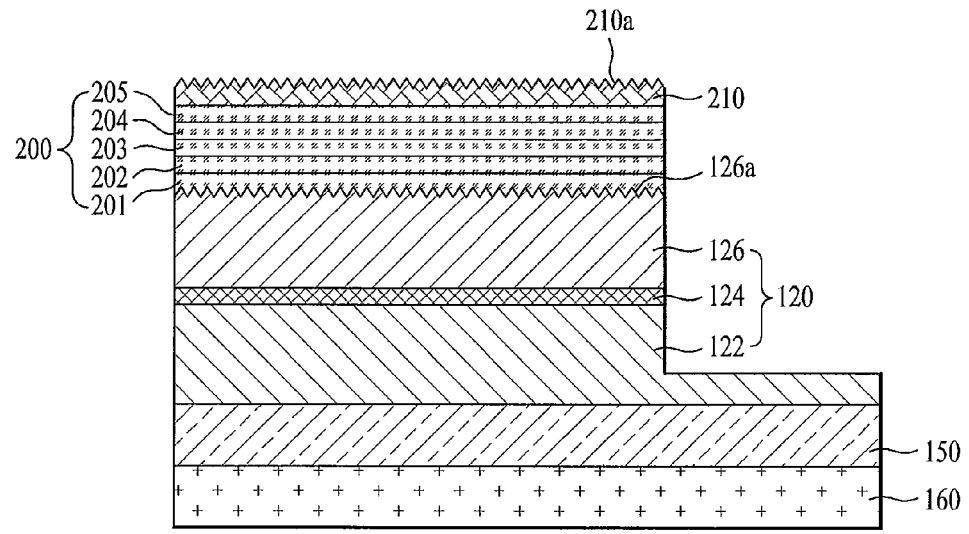

Hence, in reference to FIG. 2d, the transparent electrode layer 210 may be formed on the multi-contact layer 200 to enable the light emitting structure 120 to electrically contact with the second electrode 190. At this time, the transparent electrode layer 210 may be formed of indium tin oxide (ITO), for example.

The unevenness structure 210a may be formed on the transparent electrode layer 210, to enhance light extraction efficiency of the light emitting device.

Figure 2E:
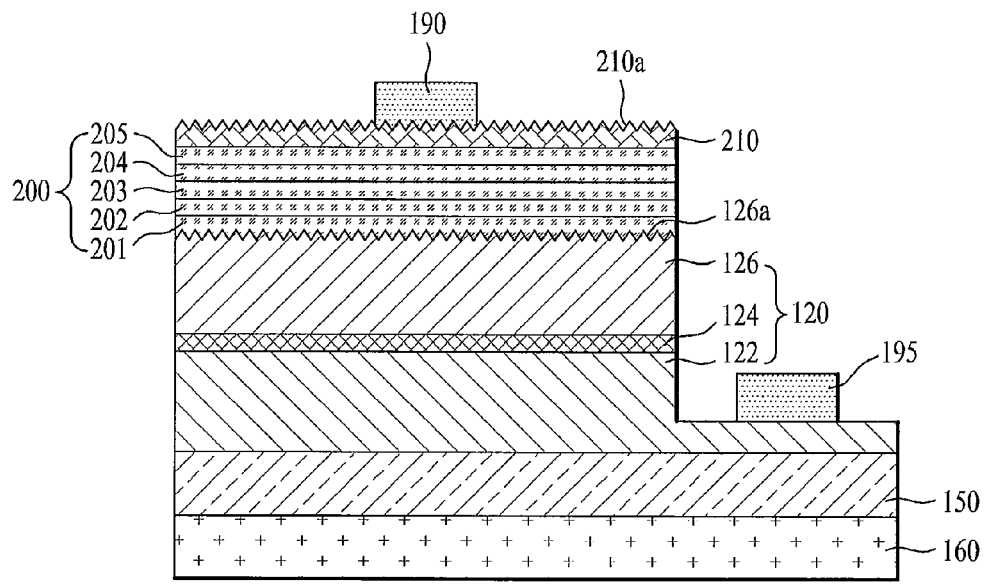

In reference to FIG. 2e, the second electrode 190 may be formed on the transparent electrode layer 210. For example, the second electrode 190 may be formed of a selected material from molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or a multilayer structure of those metals or an alloy of those metals. The second electrode 190 may be partially provided on the second conductive type semiconductor layer 126 and it may be formed by using a mask.

The first electrode 195 may be formed on an exposed region of the first conductive type semiconductor layer 122 that is exposed after mesa-etching a predetermined region of the first conductive type semiconductor layer 122. The first electrode 195 may be formed of the same material of the second electrode 190 mentioned above.

Figure 3:
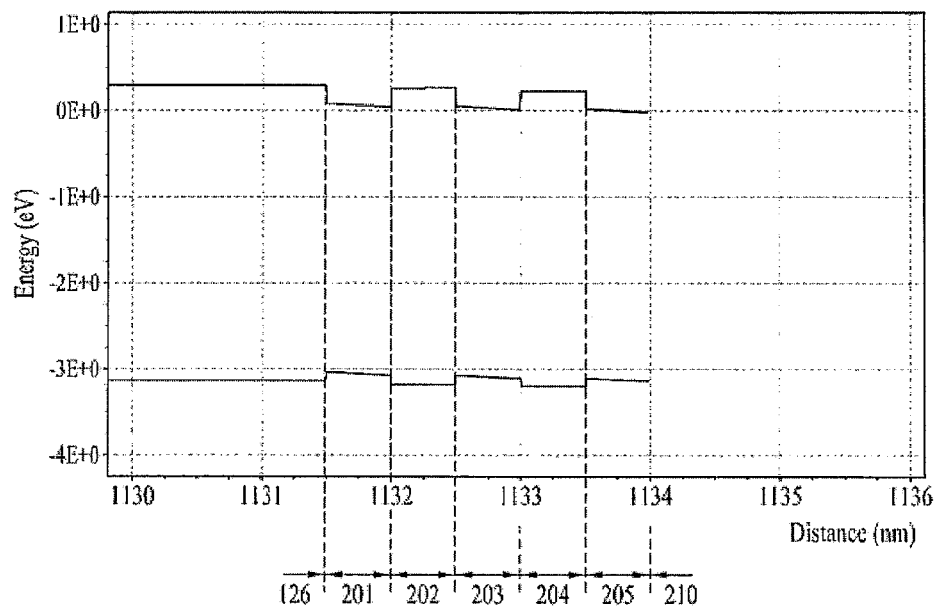
FIG. 3 is a diagram illustrating an energy band diagram of a multi-contact layer according to an embodiment.

FIG. 3 illustrates an energy band diagram according to an embodiment that is provided in the multi-contact layer.

The multi-contact layer 200 according to the embodiment may include the multi-layers overlapped with each other. Compared with a single-contact layer, the multilayered-contact layer 200 may reduce the operation voltages of the light emitting device stably.

For example, the multi-contact layer 200 may include a first layer 201 formed of InGaN having Si doped thereon, a second layer 202 formed of GaN having Si doped thereon, a third layer 203 formed of InGaN having Si doped thereon, a fourth layer 204 formed of GaN having Si doped thereon and a fifth layer 205 formed of InGaN having Si doped thereon.

At this time, the thickness of the multi-contact layer 200 may be set in a range of 5~20 Å. A carrier having passed the transparent electrode layer 210 after injected from the first electrode 195 may pass the multi-contact layer and be injected into the first conductive type semiconductor layer. Because of that, there may be an effect of reducing the operation voltages of the light emitting device.

Also, the Si included in each of the layers composing the multi-contact layer 200 may be doped in a range of $10^{18}$~$10^{18}$/cm$^2$. A doping level of In included in the InGaN layer having Si doped thereon may be set in a range of 2~8%.

In other words, if the contact layer in contact with the transparent electrode layer is a single InGan layer, the operation voltages may be reduced and a carrier recombination rate might be too high disadvantageously.

Also, if the thickness of the InGaN layer is decreased to lower the carrier recombination rate, an error might be generated in a growing process of the light emitting device and a light emitting device chip process. Because of that, the reliability of the light emitting device might be deteriorated.

As a result, the multi-contact layer 200 according to this embodiment may include the multi-layers overlapped with each other and it may reduce the operation voltages of the light emitting device stably, compared with a single-contact layer.

Figure 4:
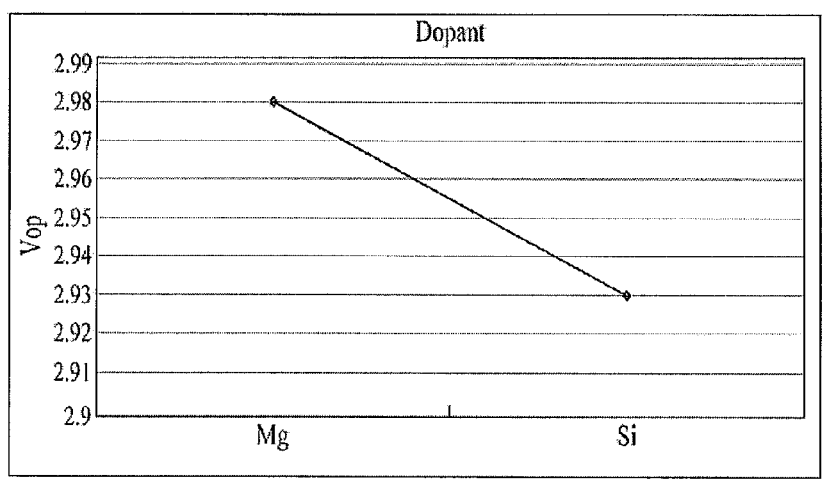
FIGS. 4 to 6 are diagrams illustrating an effect of the embodiment.

FIG. 4 is a diagram to illustrate an effect of the embodiment.

In reference to FIG. 4, the operation voltages of the light emitting device may be reduced more when the material doped on the multi-contact layer is Si that is an n-dopant than when it is Mg that is a p-dopant.

Figure 5:
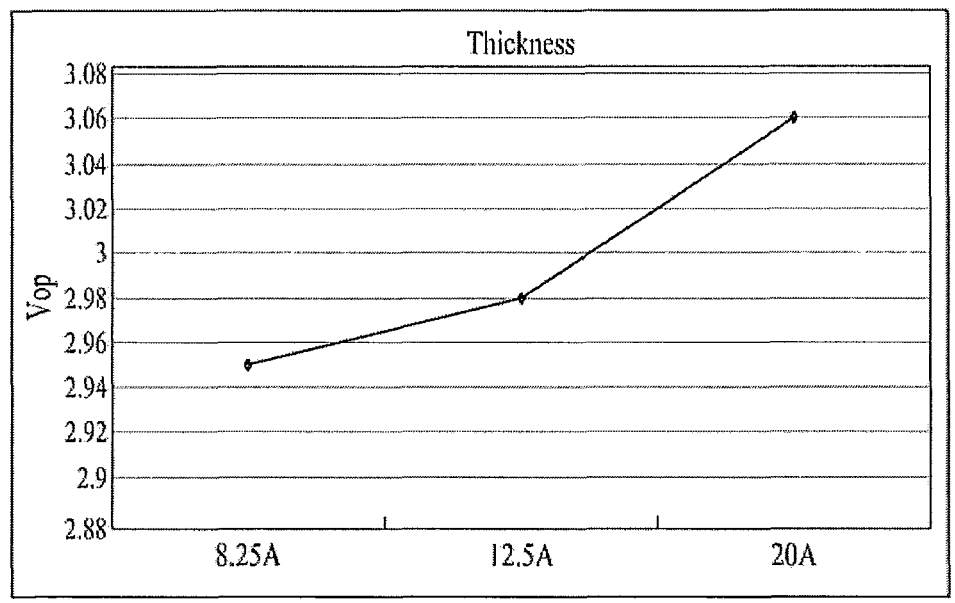

FIG. 5 is another diagram to illustrate an effect of the embodiment.

In reference to FIG. 5, the operation voltage may be reduced more when it is 8.25 Å than when the thickness of the multi-contact layer is 20 Å or 12.5 Å.

Figure 6:
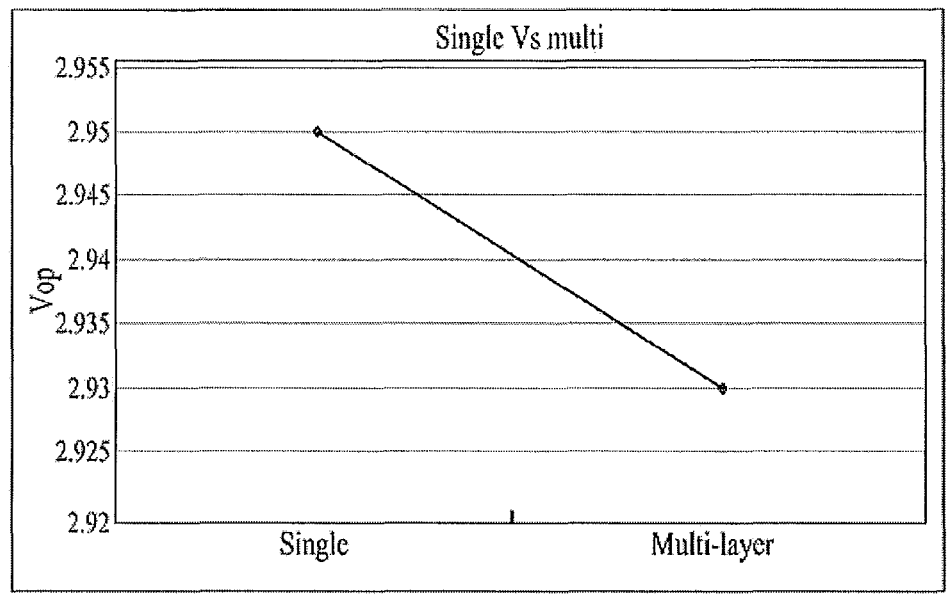

FIG. 6 is a further diagram illustrating an effect of the embodiment.

In reference to FIG. 6, the operation voltage may be reduced more when the multi-contact layer formed of InGaN is set in the light emitting device than when a single contact layer formed of InGaN.

As a result, in reference to FIGS. 4 to 6, the operation voltage may be reduced when a multi-contact layer formed of InGaN/GaN having Si doped thereon is set as the contact layer formed between the light emitting structure and the transparent electrode layer. At this time, the thickness of the multi-contact layer may be set to be 5~40 Å and the thickness of each layer may be set to be 1.25~4.0 Å as mentioned above.

So far, the embodiment that applies the multi-contact layer to the lateral light emitting device. However, the multi-contact layer according to the embodiment may be applied to a vertical light emitting device. In other words, the multi-contact layer may be formed between the second conductive type semiconductor layer and the ohmic layer in the vertical light emitting device, and it may reduce the operation voltage.

Figure 7:
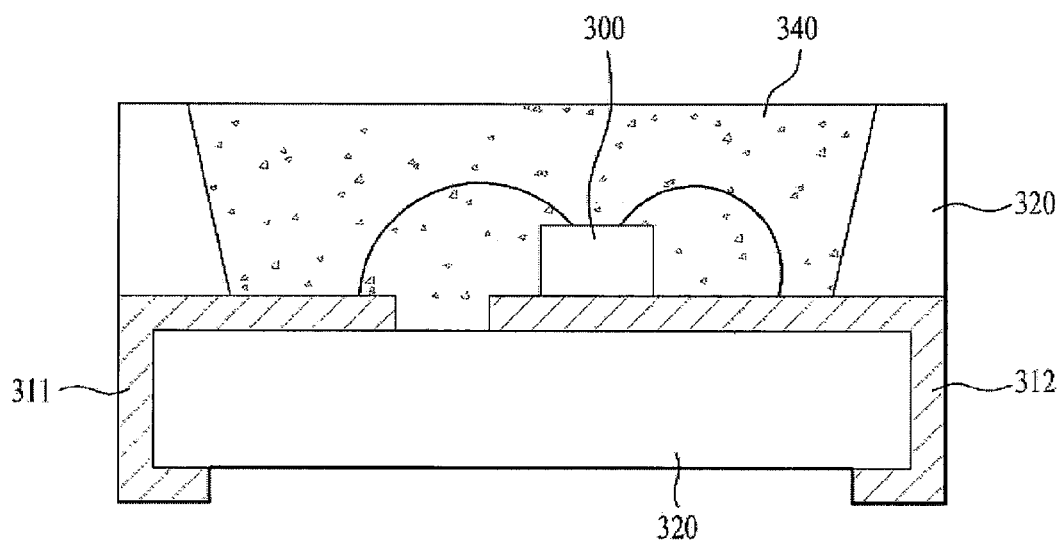
FIG. 7 is a sectional view illustrating a light emitting device package according to an embodiment.

FIG. 7 is a sectional view illustrating a light emitting device package according to an embodiment.

In reference to FIG. 7, the light emitting device according to the embodiment may include a package body 320, a first lead frame 311 and a second lead frame 222 installed on the package body 320, the light emitting device 300 according to the embodiments mentioned above that is electrically connected to the first lead frame 311 and the second lead frame 312, and a molding part 250 to surround the light emitting device 300.

The package body 320 may be formed of silicon, synthetic resin or metal. An inclined surface may be formed around the light emitting device 300 and light extraction efficiency may be enhanced.

The first lead frame 311 and the second lead frame 312 may be electrically separated from each other and they may supply electric currents to the light emitting device 300. In addition, the first lead frame 311 and the second lead frame 312 may increase luminous efficiency by reflecting the light generated from the light emitting device 300 and they may exhaust the heat generated from the light emitting device 300 outside.

The light emitting device 300 may be installed on the package body 320 or on either of the first and second lead frames 311 and 312.

The light emitting device 300 may be electrically connected to the first lead frame 311 and the second lead frame 312 by wire bonding, flip chip bonding or die bonding.

The molding part 250 may surround and protect the light emitting device 100. Also, phosphors 260 may be provided in the molding part 250 and they may convert a wavelength of the light emitted from the light emitting device 300.

The phosphors may include garnet-based phosphors, silicate-based phosphors, nitride-based phosphors or oxynitride-based phosphors.

For example, the garnet-based phosphor may be YAG ($Y_3Al_5O_{12}$:$Ce^{3+}$) or TAG ($Tb_3Al_5O_{12}$:$C^{3+}$). The silicate-based phosphor may be (Sr, Ba, Mg, Ca)$_2$SiO$_4$:Eu$^{2+}$. The nitride-based phosphor may be CaAlSiN$_3$:Eu$^{2+}$ including SiN. The oxynitride-based phosphor may be $Si_{6-x}Al_xO_xN_{8-x}$:Eu$^{2+}$ including SiON.

The plurality of the light emitting device packages according to the embodiment may be arrayed on a substrate. As optical members, a light guide plate, a prism sheet and a diffusion sheet may be arranged on a luminous passage of the light emitting device packages. Those light emitting device packages, the substrate and the optical members may be functioned as a light unit. A further embodiment may be realized by a display device, a pointing device or a lighting system including the semiconductor light emitting device or the light emitting device package according to the embodiments. For example, the lighting system may include a lamp and a streetlamp.

FIGS. 8a to 8e are diagrams illustrating a method according to another embodiment for fabricating the light emitting device according to another embodiment.

Figure 8A:
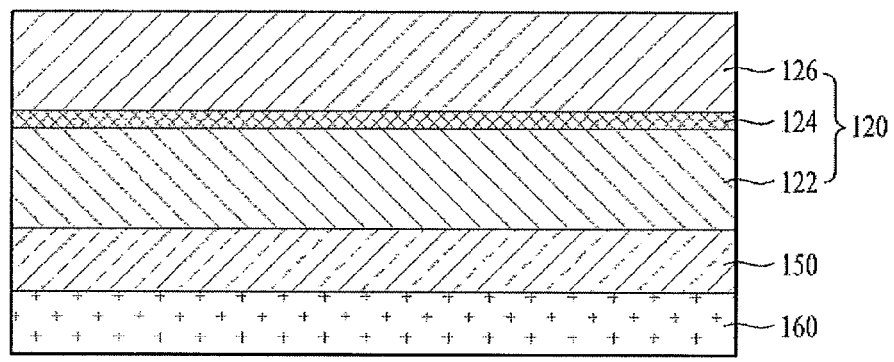
FIGS. 8a to 8e are diagrams illustrating a method according to an embodiment for fabricating a light emitting device according to another embodiment.

First of all, in reference to FIG. 8a, a light emitting structure 120 including a first conductive type semiconductor layer 122, an active layer 124 and a second conductive type semiconductor layer 126 may grow on a substrate 160. Each of the layers may be the same as described above.

A buffer layer 150 may grow between the light emitting structure 120 and the substrate 160, to reduce lattice mismatch of materials and a difference of thermal expansion coefficients.

Figure 8B:
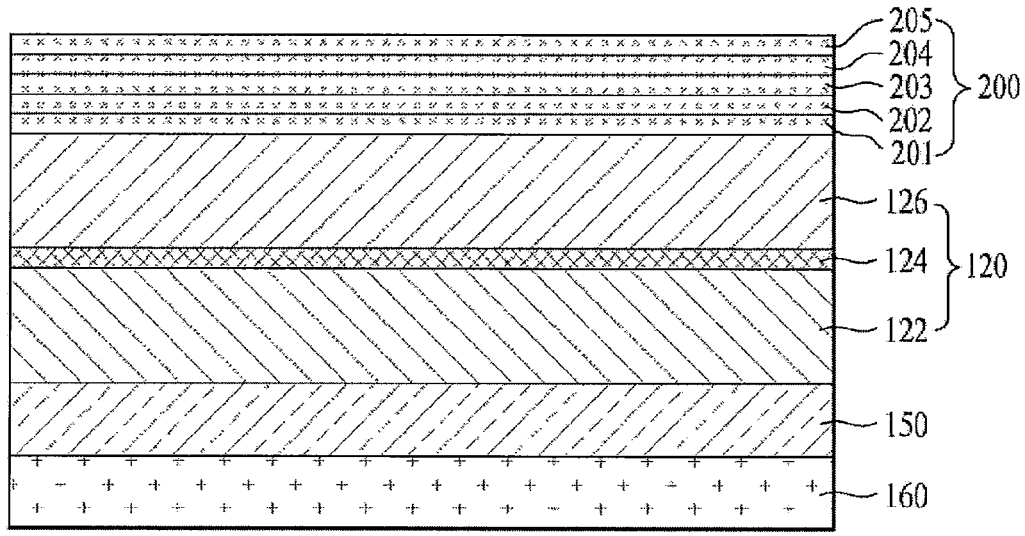

In reference to FIG. 8b, a multi-contact layer 200 may be partially formed on the light emitting structure 120.

The multi-layer contact 200 may be formed on the second conductive type semiconductor layer 126 to reduce an operation voltage of the light emitting device and detailed description of the multi-layer contact 200 is the same as mentioned above in reference to the embodiment.

Figure 8C:
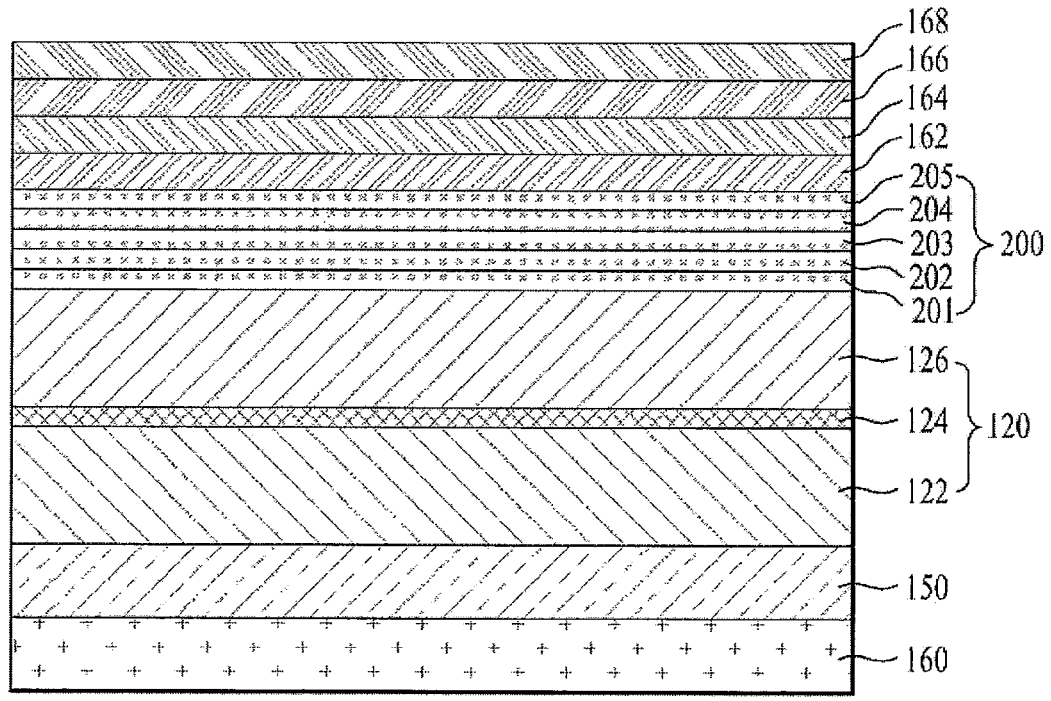

In reference to FIG. 8c, an ohmic layer 162 and a reflective layer 164 may be formed on the multi-contact layer 200. In other words, a transparent electrode may be formed as the ohmic layer 162 to improve ohmic properties of the second conductive type semiconductor layer 126 or the multi-contact layer 200.

A transparent electrode configured of two Ni/Au layers may be widely used as the transparent electrode. The Ni/Au double-layered transparent electrode may degrade a forward voltage ($V_f$) because it increase a current injection area and form ohmic contact.

In the meanwhile, a transparent conducting oxide (TCO) that is well-known for having the transmissivity of approximately 90% or more may be used as the ohmic layer 162, substituting for the Ni/Au double-layered structure having a relatively low transmissivity of approximately 60% to 70%.

The ohmic layer 162 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh or Pd. And the ohmic layer 162 may be formed by sputtering or electric beam depositing.

The thickness of the reflective layer 162 may be approximately 2500 Å. The reflective layer 162 may be a metal layer including Al, Ag, Ni, Pt, Rh or an alloy of Al, Ag, Pt or Rh. Aluminum or silver can reflect the light generated from the active layer 124 effectively, to improve light extraction efficiency of the light emitting device remarkably.

A conductive supporting substrate 168 may be formed on the reflective layer 164 and the conductive supporting substrate 168 may be used as a second electrode.

The configuration of the conductive supporting substrate 168 may be the same as described above and the conductive supporting substrate 168 may be formed by electrochemical metal deposition or eutectic metal bonding. To adhere the reflective layer 164 to the conductive supporting substrate 168, the reflective layer 164 may be used as an adhesion layer or an adhesion layer 166 may be provided. The adhesion layer 166 may be formed of a selected material from a group configured of Au, Sn, In, Al, Si Ag, Ni and Cu or an alloy of those materials.

The conductive supporting substrate 168 may have a similar crystalline structure and a similar crystalline lattice constant to soft metals with a good thermal conductivity and the metals mentioned above. Because of that, the conductive supporting substrate 168 may minimize inner stress generation in an alloying process and it may have a large mechanical strength.

Figure 8D:
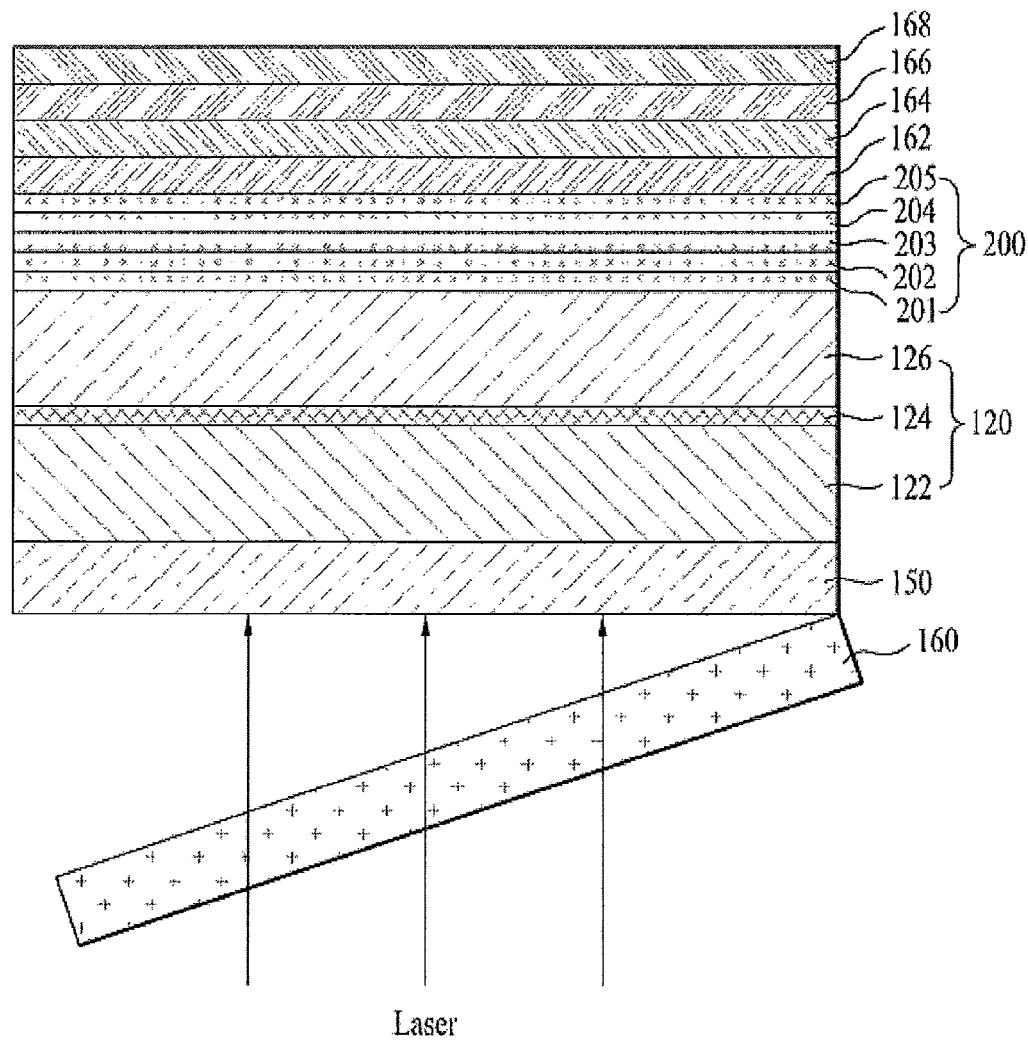

In reference to FIG. 8d, the substrate 160 may be separated from the first conductive type semiconductor layer 122. The separation of the substrate 110 may be performed based on laser lift off (LLO) that uses excimer laser or based on dry-etch and wet-etch.

In the laser lift off as an example, excimer laser light having a preset wavelength range is focused toward the substrate 160. After that, a thermal energy is focused on an edge of the light emitting structure 120 and the edge is divided into gallium molecules and nitrogen molecules. The substrate 110 is momentarily separated along a region the laser light passes while the edge of the first conductive type semiconductor layer 122 is divided into the gallium molecules and the nitrogen molecules. At this time, the buffer layer 150 may be separated together.

Figure 8E:
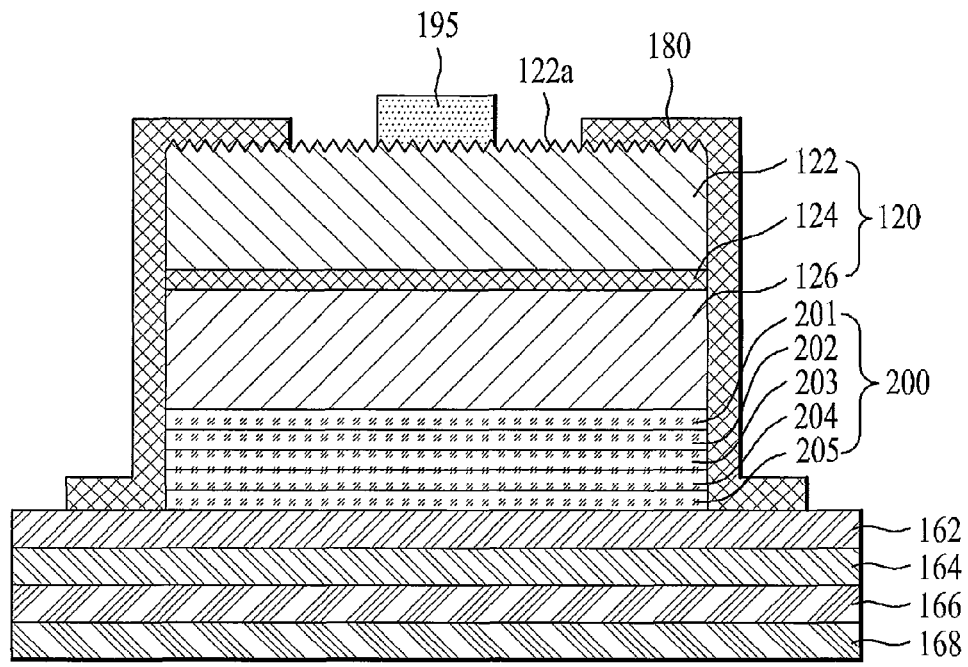

Hence, in reference to FIG. 8e, the light emitting structure 120 may be diced in devices units. After that, the first electrode 195 may be formed on the first conductive type semiconductor layer 122 provided in each of the separated light emitting structures 120. The first electrode 195 may be activated as n-electrode and it may include at least one of Al, Ti, Cr, Ni, Cu or Au, in a single-layered or multi-layered structure.

Before the first electrode 195 is formed, an unevenness structure 122a may be formed on the first conductive type semiconductor layer 122 and the unevenness structure 122a may enhance the light extraction efficiency of the light emitting structure.

A passivation layer 180 may be deposited on lateral surfaces of the light emitting structure 120 and the passivation layer 180 may be formed of an insulative material. For example, the passivation layer 180 may be configured of a silicon oxide ($SiO_2$) layer, an oxynitride layer and an aluminum oxide layer.

Figure 9:
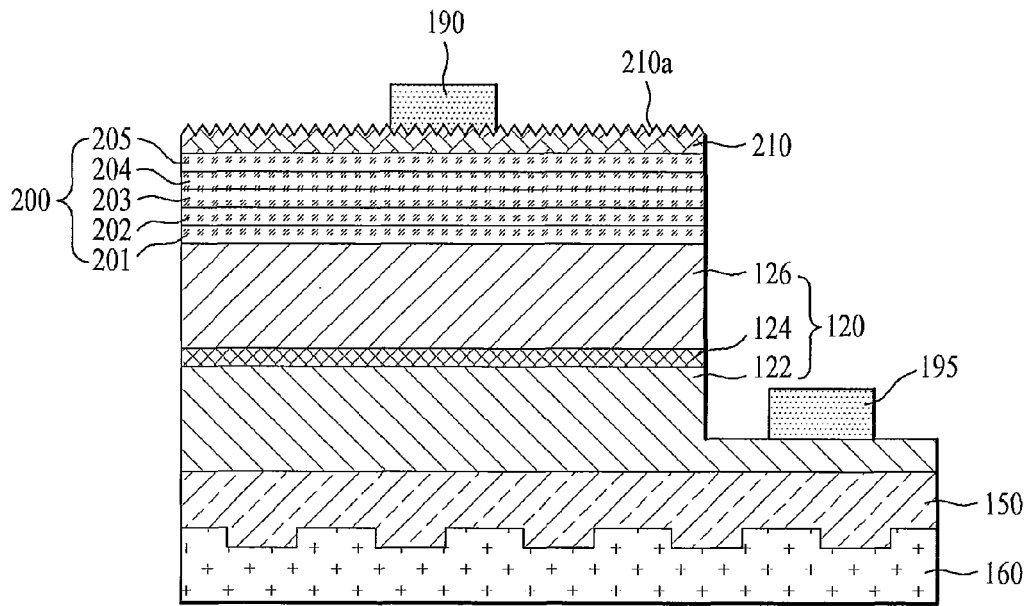
FIG. 9 is a diagram illustrating a light emitting device according to a further embodiment.

FIG. 9 is a diagram illustrating a light emitting device according to another embodiment.

A light emitting device provided in the light emitting device package according to this embodiment may be a vertical light emitting device. Compared with the embodiment shown in FIG. 1, a patterned light extraction structure may be formed on a surface of a substrate 160 to enhance light extraction efficiency.

The transparent electrode layer 210 may include an unevenness structure formed on a surface thereof and the light generated from the active layer may be scattered-reflected in the unevenness structure 210a, not full-reflected, only to enhance light extraction efficiency of the light emitting device.

Figure 10:
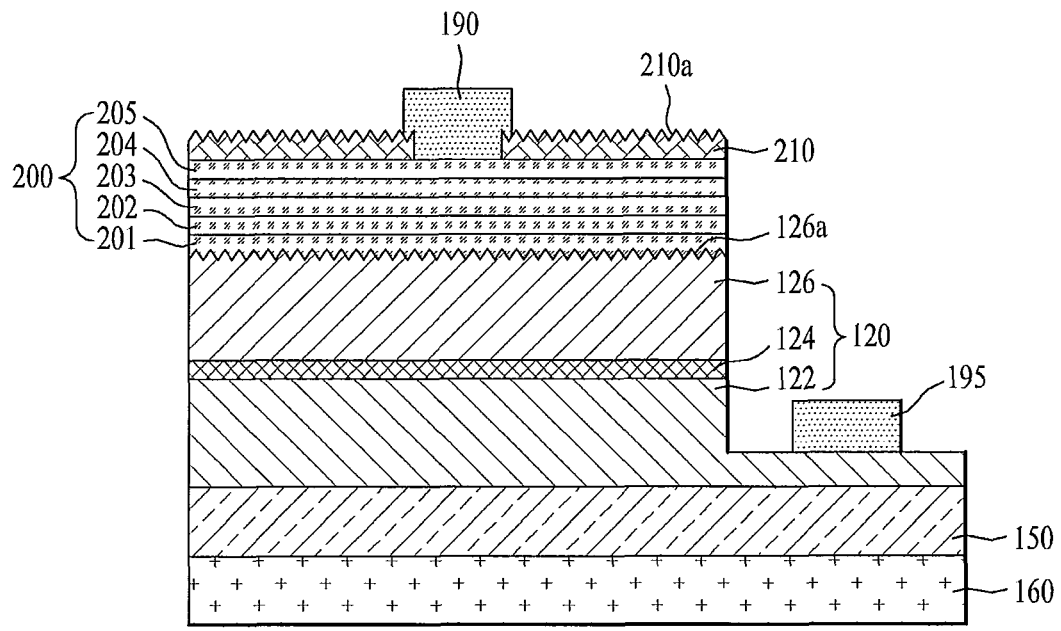
FIG. 10 is a diagram illustrating a light emitting device according to a still further embodiment.

FIG. 10 is a diagram illustrating a light emitting device according to a further embodiment.

The light emitting device according to this embodiment may be a lateral light emitting device and a transparent electrode layer 210 may be located between a second electrode 190 and a second conductive type semiconductor layer 126 of a light emitting structure 120.

The transparent electrode layer 210 may have an open region formed corresponding to the second electrode 190 and the second electrode 190 may be located in the open region.

The light emitting device according to this embodiment may include the multi-contact layer provided on the light emitting structure, only to reduce the operation voltage. Because of that, the light emitting device may have an advantageous effect of improving the performance thereof.

The unevenness structure 210a may be formed on a top of the light emitting device according to this embodiment, like the embodiment shown in FIG. 9. The light generated from the active layer may be scattered-reflected in the unevenness structure, not full-reflected, and the light extraction efficiency of the light emitting device may be enhanced.

Figure 11:
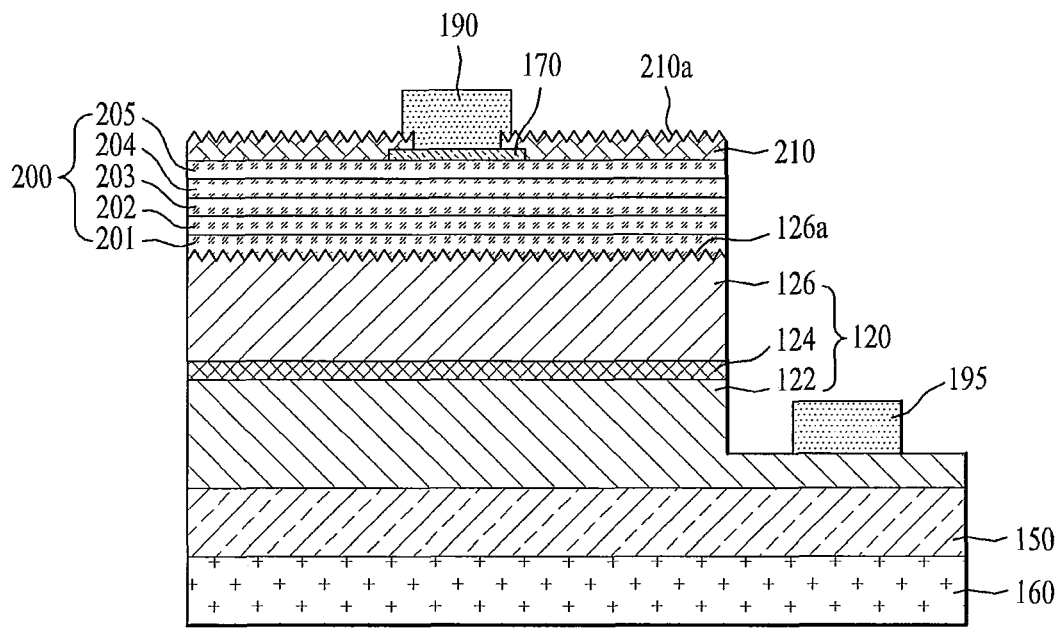
FIG. 11 is a diagram illustrating a light emitting device according to a still further embodiment.

FIG. 11 illustrates a light emitting device according to another embodiment.

The light emitting device according to this embodiment may be a lateral light emitting device and a transparent electrode layer 210 may be located between a second electrode 190 and a second conductive type semiconductor layer 126 of a light emitting structure 120.

The transparent electrode layer 210 may have an open region formed corresponding to the second electrode 190 and a current blocking layer 170 may be located in the open region.

A bottom surface of the second electrode 190 may contact with the current blocking layer 170.

The current blocking layer 170 may have the thickness of approximately 100 nm and it may include at least one of $SiO_2$ and $SiN_2$, for example.

The current blocking layer 170 may be partially overlapped with the second electrode 190. Accordingly, currents may be prevented from concentrated on a center of the light emitting structure 120 and they may be diffused along a transverse direction.

Referring to FIG. 11, an upper surface of the current blocking layer 170 may contact with the second electrode 190 and a lower surface of the current blocking layer 170 may contact with the multi-contact layer 200.

Figure 12:
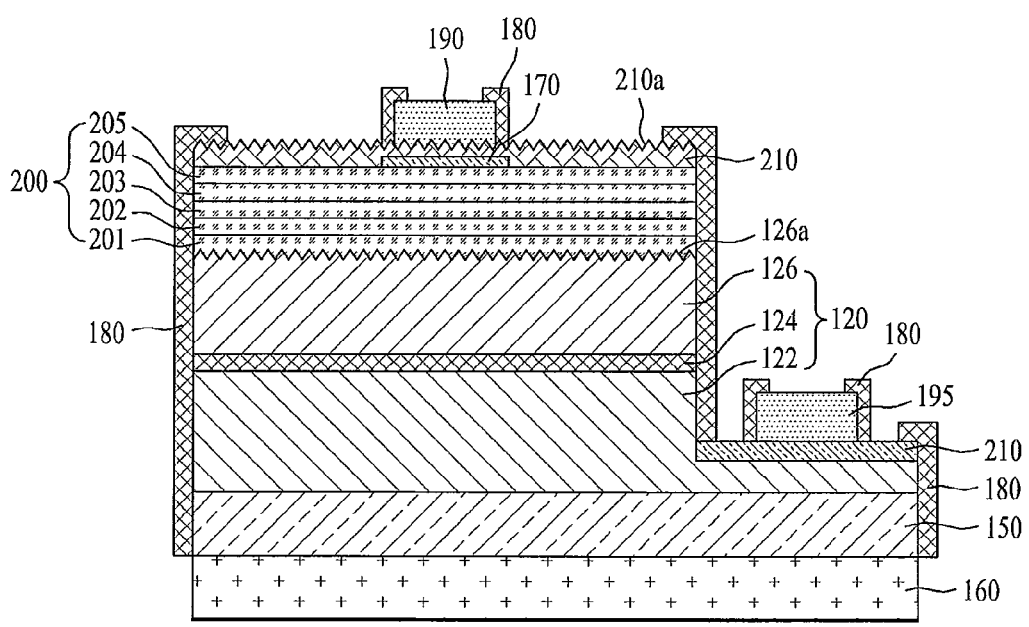
FIG. 12 is a diagram illustrating a light emitting device according to a still further embodiment.

FIG. 12 illustrates a light emitting device according to a further embodiment.

A light emitting device according to this embodiment may be a lateral light emitting device. A transparent electrode layer 210 may be located between a second electrode 190 and a second conductive type semiconductor layer 126 of a light emitting structure 120 and between a first electrode 195 and a first conductive type semiconductor layer 122 of the light emitting structure 120, respectively.

The transparent electrode layer 210 may have open regions formed corresponding to the second electrode 190. Current blocking layer 170 may be located in the open region.

The current blocking layer 170 located in the transparent electrode 210 disposed between a multi-contact layer 200 and the second electrode 190 may be partially overlapped with the second electrode 190. The current blocking layer 170 may prevent current from concentrated on the center of the light emitting structure 120, to diffuse the current along a transverse direction.

In FIG. 12, it is shown that a lower surface of the transparent electrode layer 210 is open to enable the current blocking layer 170 to contact with the multi-contact layer 200 and this is one of examples. Alternatively, an upper surface of the transparent electrode layer 210 may be also open to enable the current blocking layer 170 to contact with the second electrode 190 and the multi-contact layer 200. In other words, the upper surface of the current blocking layer 170 may contact with the second electrode 190 and the lower surface of the current blocking layer 170 may contact with the multi-contact layer 200, as described in FIG. 11.

In reference to FIG. 12, a passivation layer 180 may be located on lateral surfaces of the first electrode 195 and the second electrode 190 as well as a lateral surface of the light emitting structure 120.

The passivation layer 180 may be formed of an insulative material such as non-conductivity oxide or nitride, for example, a silicon oxide ($SiO_2$) layer, an oxide nitride layer or an oxide aluminum layer.

Description for the other elements may be identical to description for those of the embodiments mentioned above and it will be omitted accordingly.

Figure 13:
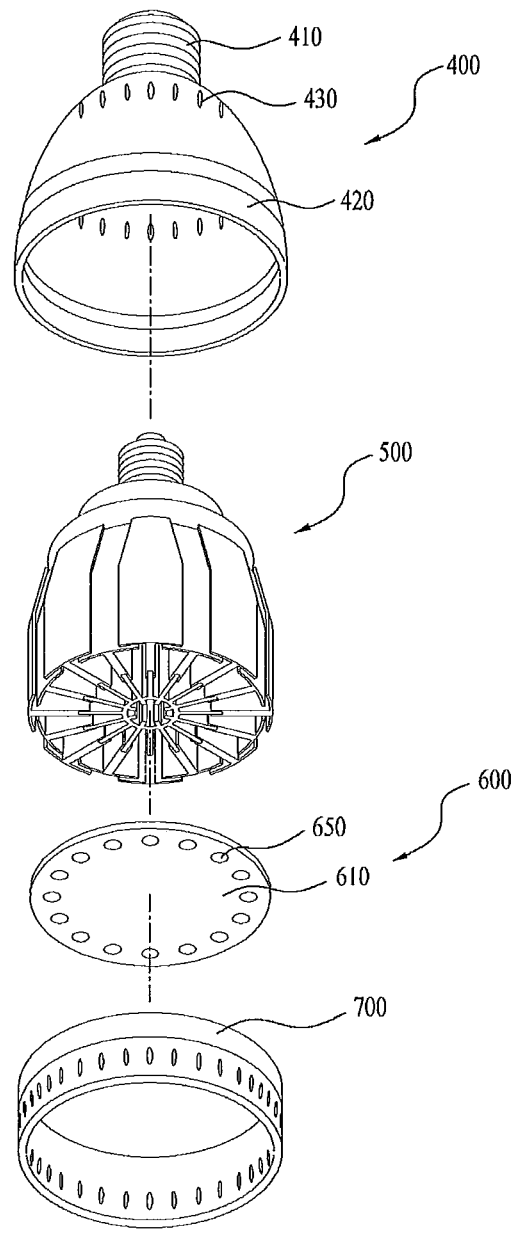
FIG. 13 is a diagram illustrating a lighting system according to an embodiment, in which the light emitting device package according to the embodiments is disposed.

FIG. 13 is an exploded perspective view illustrating a lighting system according to an embodiment that includes the light emitting device package according to the embodiments.

In reference to FIG. 13, the lighting system according to this embodiment may include a light source 600 to emit light, a housing 400 to mount the light source 600 therein, a radiation part 500 to radiate the heat of the light source 600, and a holder 700 to couple the light source 600 and the radiation part 500 to the housing 400.

The housing 400 may include a socket coupling part 410 coupled to an electric socket (not shown) and a housing body part 420 connected to the socket coupling part 410 to mount the light source 600 therein. A single air-hole 430 may be formed through the housing body part 420.

A plurality of air holes 430 may be provided in the housing body part 420 of the housing 400. A single air hole may be provided or a plurality of air holes may be arranged along a radial direction as shown in FIG. 12. Rather than the radial arrangement, other various arrangements of the air holes may be possible.

The light source 600 may include a plurality of the light emitting modules 650 disposed on a circuit board 610. Here, the circuit board 610 may be formed in a shape that is able to be inserted in an opening of the housing 400 and it may be formed of a material having a high thermal conductivity to transmit heat to the radiation part 500 which will be described in detail later.

The holder 700 may be provided under the light source and the holder 700 may include a frame and another air hole. Although not shown in the drawing, under the light source 600 may be provided optical members to diffuse, scatter or collect the light emitted from the light emitting modules of the light source 600. The lighting system according to this embodiment may use the light emitting device package, of which light extraction is enhanced, for enhancing the luminous efficiency.

Figure 14:
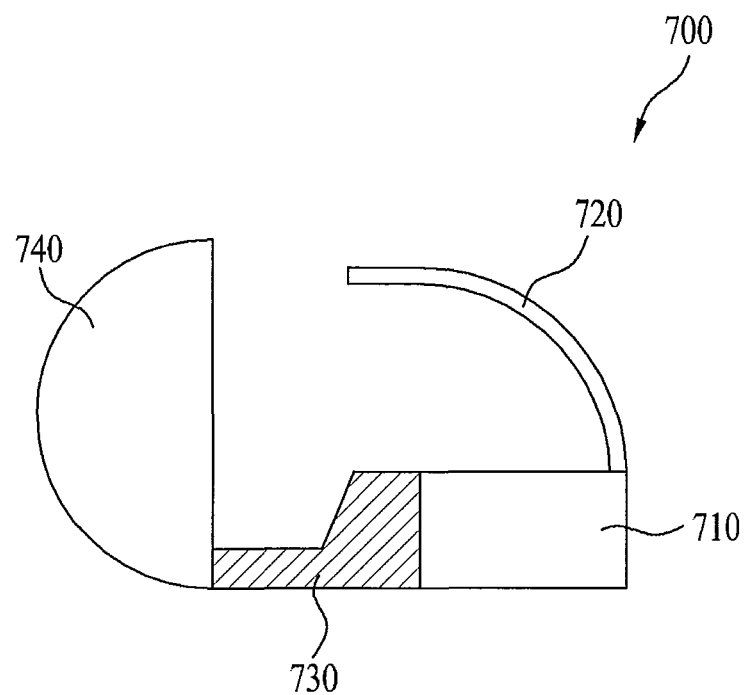
FIG. 14 is a diagram illustrating a head lamp according to an embodiment, in which the light emitting device package according to the embodiments is disposed.

FIG. 14 is a diagram illustrating a head lamp according to an embodiment in which the light emitting device disposed.

In reference to FIG. 14, the light emitted from a light emitting module 710 in which the light emitting device package according to the embodiments is disposed may be reflected in a reflector 720 and a shade 730. After that, the reflected light may transmit a lens 740 and travel forward.

The plurality of the light emitting devices may be mounted on the light emitting device package provided in the light emitting module 710 and the embodiment is not limited thereto.

Figure 15:
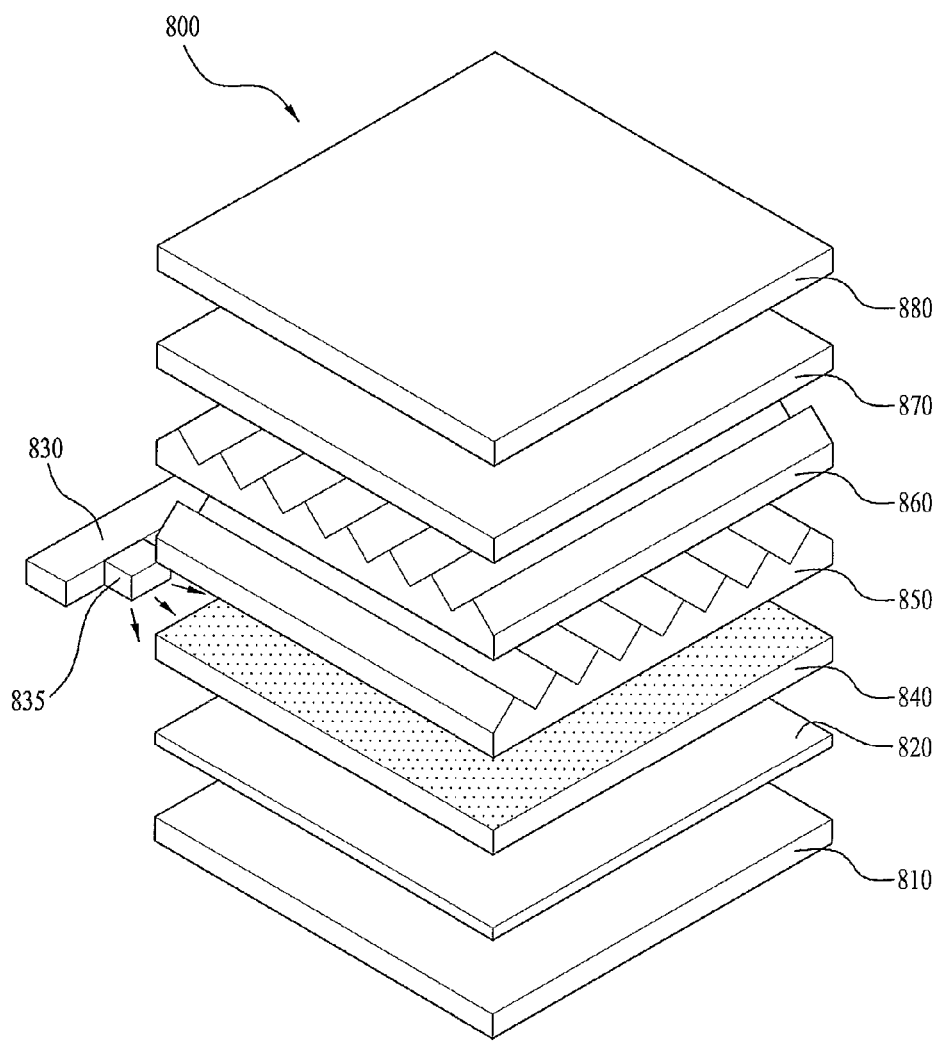
FIG. 15 is a diagram illustrating a display device according to an embodiment, in which the light emitting device package according to the embodiments is disposed.

FIG. 15 is a diagram illustrating a display device according to an embodiment in which the light emitting device package according to the embodiments is disposed.

In reference to FIG. 15, a display device 800 according to this embodiment may include light source modules 830 and 835, a reflective plate 820 disposed on a bottom cover 810, a light guide panel 840 disposed in front of the reflective plate 820 to guide light emitted from the light source modules to a front part of the image display device, a first prism sheet 850 and a second prism sheet 860 disposed in front of the light guide panel 840, a display panel 870 disposed in front of the second prism sheet 860, an image signal output circuit 872 connected to the display panel 870 to supply an image signal to the display panel 870, and a color filter 880 disposed in front of the panel 870.

The light source module may include the light emitting device packages 835 described above disposed on a circuit board 830. Here, a PCB may be used as the circuit board 830 and the light emitting device packages 835 may be the same as described above.

The bottom cover 810 may accommodate elements provided in the image display device 800. The reflective plate 820 may be provided as a separate element as shown in FIG. 14 or it may be provided by coating a rear surface of the light guide panel 840 or a front surface of the bottom cover 810 with a material having a high reflectivity.

Here, the reflective plate 820 may be formed of a material having a high reflectivity that is useable in an ultra-thin type such as polyethylene terephthalate (PET).

The light guide panel 840 may scatter the light emitted from the light emitting device package module, to uniformly distribute the light throughout an entire screen of the liquid crystal display device. As a result, the light guide panel 840 may be formed of a material having a high index of refraction and a high transmissivity such as polymethylemethacrylate (PMMA), polycarbonate (PC) or polyethylene (PE). Further, an air guide-type display device in which the light guide panel 840 is omitted and in which light is transmitted in a space above the reflective plate 820.

The first prism sheet 850 may be formed of a light transmissive polymer having elasticity on a surface of a support film. The polymer may have a prism layer having a plurality of three-dimensional structures formed thereon repeatedly. Here, the plurality of the patterns may be formed in a strip type having crests and troughs repeated therein.

A direction of crests and troughs formed on a surface of a support film of the second prism sheet 860 may be perpendicular to a direction of the crests and troughs formed in a surface of the support film of the first prism sheet 850. This may serve to uniformly distribute the light transmitted from the light source module and the reflective plate 820 in all directions of the panel 870.

Although the first prism sheet 850 and the second prism sheet 860 compose an optical sheet in this embodiment, the optical sheet may be configured of another combination, for example, a micro lens array, a combination of a diffusion sheet and a lens array or combination of a prism sheet and a lens array.

As the panel 870, a liquid crystal display panel may be provided or other kinds of display devices requiring a light source may be provided instead of the liquid crystal display panel.

The panel 870 may have a structure in which a liquid crystal layer is located between glass bodies, with polarizing plates mounted on the glass bodies, respectively, to utilize polarization of light. Here, the liquid crystal layer may have intermediate properties between a liquid and a solid in which organic molecules having fluidity like a liquid, i.e., liquid crystal, are regularly arranged. The panel may display an image, using changed molecular arrangement by an external electric field.

The liquid crystal display panel used in the image display device may be formed as an active matrix, and it may use transistors as switches to adjust voltage supplied each of the pixels.

The floor filter 880 may be provided on the front surface of the panel 870. The color filter 880 may transmit only red, green and blue light from lights projected by the panel 870 per one pixel, only to display an image.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting diode comprising:
a light emitting structure comprising a first conductive type semiconductor layer doped with a first conductive type dopant, an active layer, and a second conductive type semiconductor layer doped with a second conductive type dopant, wherein the first conductive type semiconductor layer, the active layer and the second conductive type semiconductor layer are disposed adjacent to each other, and the active layer comprises a well layer and a barrier layer which are alternatively stacked at least one time, and an energy band gap of the well layer is smaller than an energy band gap of the barrier layer;
a multi-contact layer directly disposed on at least a predetermined region of the second conductive type semiconductor layer, the multi-contact layer comprising at least one pair-structure configured of a first layer comprising InGaN having a first dopant doped thereon and a second layer comprising GaN having a second dopant doped thereon, wherein each of the first dopant and the second dopant is a first conductive type dopant; and
a first electrode and a second electrode to provide currents to the first conductive type semiconductor layer and the second conductive type semiconductor layer, respectively;
wherein the first conductive type semiconductor layer, the active layer, the second conductive type semiconductor layer, the multi-contact layer and the first and second electrodes are disposed, with the same directivity, and the second conductive type semiconductor layer and the multi-contact layer are differently doped and an n-p tunnel junction is formed between the second conductive type semiconductor layer and the multi-contact layer.

2. The light emitting diode according to claim 1, wherein each of the first dopant and the second dopant is Si, Ge, Sn, Se or Te.

3. The light emitting diode according to claim 1, wherein a doping level of the first layer or the second layer is $10^{18} \sim 10^{19}/cm^2$.

4. The light emitting diode according to claim 1, wherein a concentration level of In included in the first layer is in a range of 2~8%.

5. The light emitting diode according to claim 1, wherein the thickness of the multi-contact layer is in a range of 5~40 Å.

6. The light emitting diode according to claim 1, wherein the thickness of the first layer or the second layer is in a range of 1.25~4.0 Å.

7. The light emitting diode according to claim 1, wherein the multi-contact layer comprises a first layer configured of InGaN having Si doped thereon, a second layer configured of GaN having Si doped thereon, a third layer configured of InGAN having Si doped thereon, and a fourth layer configured of InGaN having Si doped thereon.

8. The light emitting diode according to claim 1, further comprising:
an transparent electrode layer disposed on the multi-contact layer.

9. The light emitting diode according to claim 1, wherein an unevenness structure is provided on a surface of the second conductive type semiconductor layer.

10. The light emitting diode according to claim 1, further comprising:
a current blocking layer having at least predetermined region overlapped with the second electrode.

11. The light emitting diode according to claim 1, wherein the light emitting structure is formed on a substrate and a light extraction structure is provided on a surface of the substrate, adjacent to the light emitting structure.

12. The light emitting diode according to claim 8, wherein a top surface of the transparent electrode layer includes an unevenness structure.

13. The light emitting diode according to claim 1, wherein the second electrode is a conductive supporting substrate.

14. The light emitting diode according to claim 1, further comprising:
a passivation layer disposed around the light emitting structure, the passivation layer formed of an insulation material.

15. A light emitting device package comprising:
a package body;
a first lead frame and a second lead frame disposed at the package body; and
a light emitting diode disposed in the package body, with being electrically connected with the first and second lead frames,
wherein, the light emitting diode comprises a light emitting structure comprising a first conductive type semiconductor layer, an active layer and a second conductive type semiconductor layer, wherein the first conductive type semiconductor layer, the active layer and the second conductive type semiconductor layer are disposed adjacent to each other, and the active layer comprises a well layer and a barrier layer which are alternatively stacked at least one time, and an energy band gap of the well layer is smaller than an energy band gap of the barrier layer; a multi-contact layer disposed on at least predetermined region of the second conductive type semiconductor layer, the multi-contact layer comprising at least one pair-structure configured of a first layer comprising InGaN having a dopant doped thereon and a second layer comprising GaN having a different dopant doped thereon; and a first electrode and a second electrode to provide currents to the first conductive type semiconductor layer and the second conductive type semiconductor layer, respectively,
wherein the first conductive type semiconductor layer, the active layer, the second conductive type semiconductor layer, the multi-contact layer and the first and second electrodes are disposed, with the same directivity.

16. The light emitting device package according to claim 15, wherein the dopant is a first conductive type dopant comprising Si, Ge, Sn, Se or Te.

17. The light emitting device package according to claim 15, wherein the dopant is a second conductive type dopant comprising Mg, Zn, Ca, Sr or Ba.

18. The light emitting device package according to claim 15, wherein a doping level of the first layer or the second layer is $10^{18} \sim 10^{19}/cm^2$.

19. A lighting system comprising:
a light source comprising a plurality of light emitting device packages disposed on a substrate, to emit light;
a housing having the light source therein;
a radiation part to radiate the heat of the light source; and
a holder to couple the light source and the radiation part to the housing,
wherein the light emitting device package comprises a package body; a first lead frame and a second lead frame disposed at the package body; and a light emitting diode disposed in the package body, with being electrically connected with the first and second lead frames, and
wherein the light emitting diode comprises a light emitting structure comprising a first conductive type semiconductor layer, an active layer and a second conductive type semiconductor layer, wherein the first conductive type semiconductor layer, the active layer and the second conductive type semiconductor layer are disposed adjacent to each other and the active layer comprises a well layer and a barrier layer which are alternatively stacked at least one time, and an energy band gap of the well layer is smaller than an energy band gap of the barrier layer; a multi-contact layer disposed on at least predetermined region of the second conductive type semiconductor layer, the multi-contact layer comprising at least one pair-structure configured of a first layer comprising InGaN having a dopant doped thereon and a second layer comprising GaN having a different dopant doped thereon; and a first electrode and a second electrode to provide currents to the first conductive type semiconductor layer and the second conductive type semiconductor layer, respectively, and wherein the first conductive type semiconductor layer, the active layer, the second conductive type semiconductor layer, the multi-contact layer and the first and second electrodes are disposed, with the same directivity.

20. The light emitting diode according to claim 1, wherein the first conductive type dopant is n-type dopant and the second conductive type dopant is p-type dopant.

* * * * *